(12) United States Patent
Kim

(10) Patent No.: US 11,832,436 B2
(45) Date of Patent: Nov. 28, 2023

(54) SEMICONDUCTOR MEMORY DEVICE AND METHOD FOR FABRICATING THE SAME

(71) Applicant: SK hynix Inc., Gyeonggi-do (KR)

(72) Inventor: Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 105 days.

(21) Appl. No.: 17/505,398

(22) Filed: Oct. 19, 2021

(65) Prior Publication Data

US 2022/0375853 A1    Nov. 24, 2022

(30) Foreign Application Priority Data

May 20, 2021    (KR) .......................... 10-2021-0064836

(51) Int. Cl.

| | |
|---|---|
| *H10B 12/00* | (2023.01) |
| *H01L 23/522* | (2006.01) |
| *G11C 5/06* | (2006.01) |
| *H01L 23/528* | (2006.01) |
| *G11C 5/02* | (2006.01) |

(52) U.S. Cl.
CPC .............. *H10B 12/30* (2023.02); *G11C 5/025* (2013.01); *G11C 5/06* (2013.01); *H01L 23/528* (2013.01); *H01L 23/5226* (2013.01); *H10B 12/488* (2023.02)

(58) Field of Classification Search
CPC ... G11C 11/404; G11C 11/4097; G11C 5/025; G11C 5/06; G11C 5/12; H01L 21/76897; H01L 21/823475; H01L 23/5226; H01L 23/528; H01L 25/0657; H01L 28/86; H10B 12/03; H10B 12/0335; H10B 12/09; H10B 12/30; H10B 12/488
See application file for complete search history.

(56) References Cited

U.S. PATENT DOCUMENTS

| | | | |
|---|---|---|---|
| 9,818,693 B2 | 11/2017 | Toyama et al. | |
| 2004/0099957 A1* | 5/2004 | Jin ..................... | H01L 21/76885 257/E21.507 |
| 2016/0119722 A1* | 4/2016 | Chu ..................... | H04R 31/006 438/51 |
| 2020/0035702 A1* | 1/2020 | Lee ........................ | H10B 41/41 |

* cited by examiner

Primary Examiner — Mohammad M Hoque
Assistant Examiner — Kevin Quinto
(74) Attorney, Agent, or Firm — IP & T GROUP LLP

(57) ABSTRACT

A semiconductor memory device includes: a peripheral circuit portion including an interconnection; first and second word line stacks that are spaced apart from each other over the peripheral circuit portion, the first and second word line stacks including word lines, respectively; an alternating stack of dielectric layers that are positioned over the peripheral circuit portion and disposed between the first and second word line stacks; a first contact plug penetrating the alternating stack to be coupled to the interconnection; a second contact plug coupled to the word lines of the first and second word line stacks; a first line-shape supporter between the first word line stack and the alternating stack, and extending vertically from the peripheral circuit portion; and a second line-shape supporter between the second word line stack and the alternating stack, and extending vertically from the peripheral circuit portion.

19 Claims, 19 Drawing Sheets

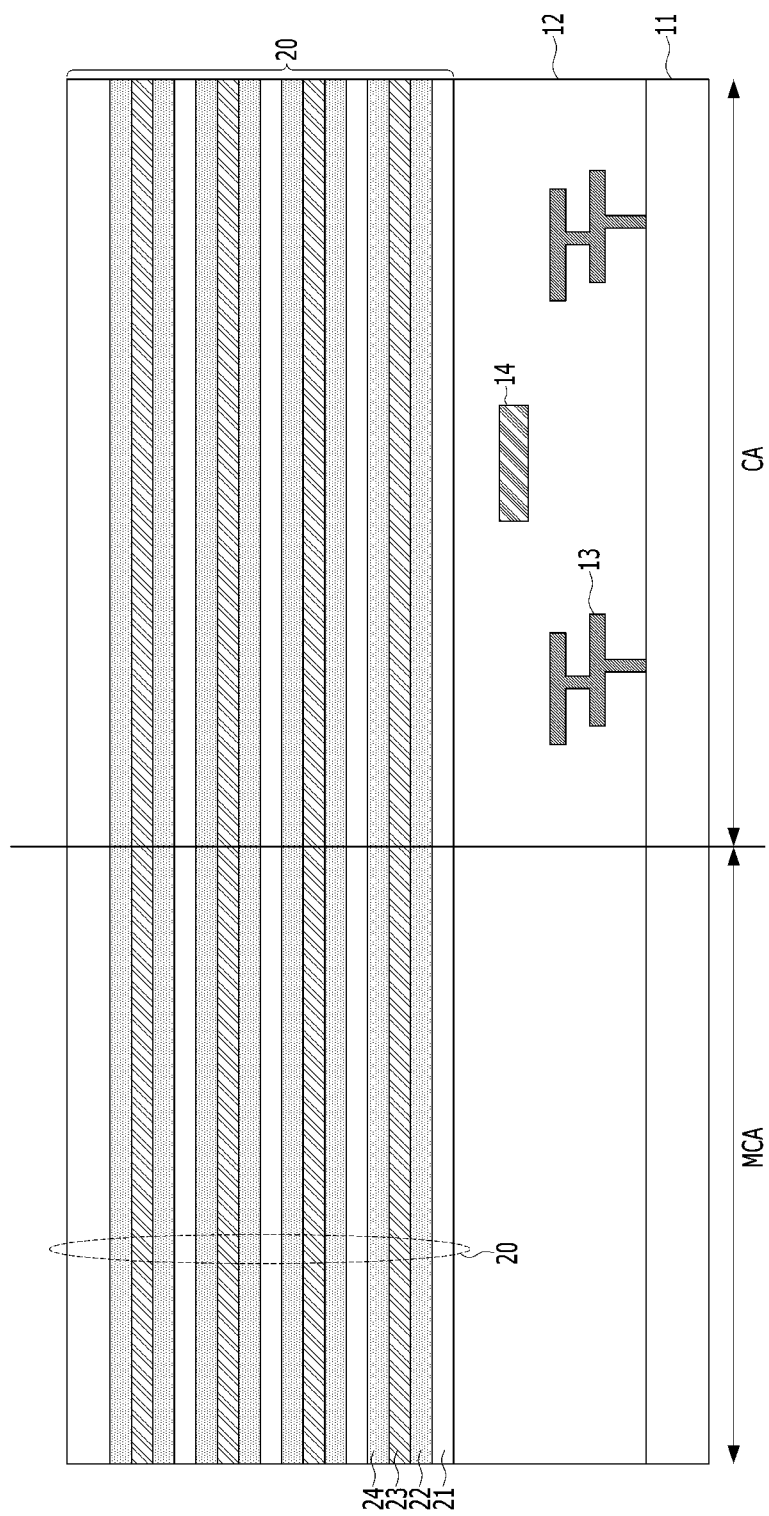

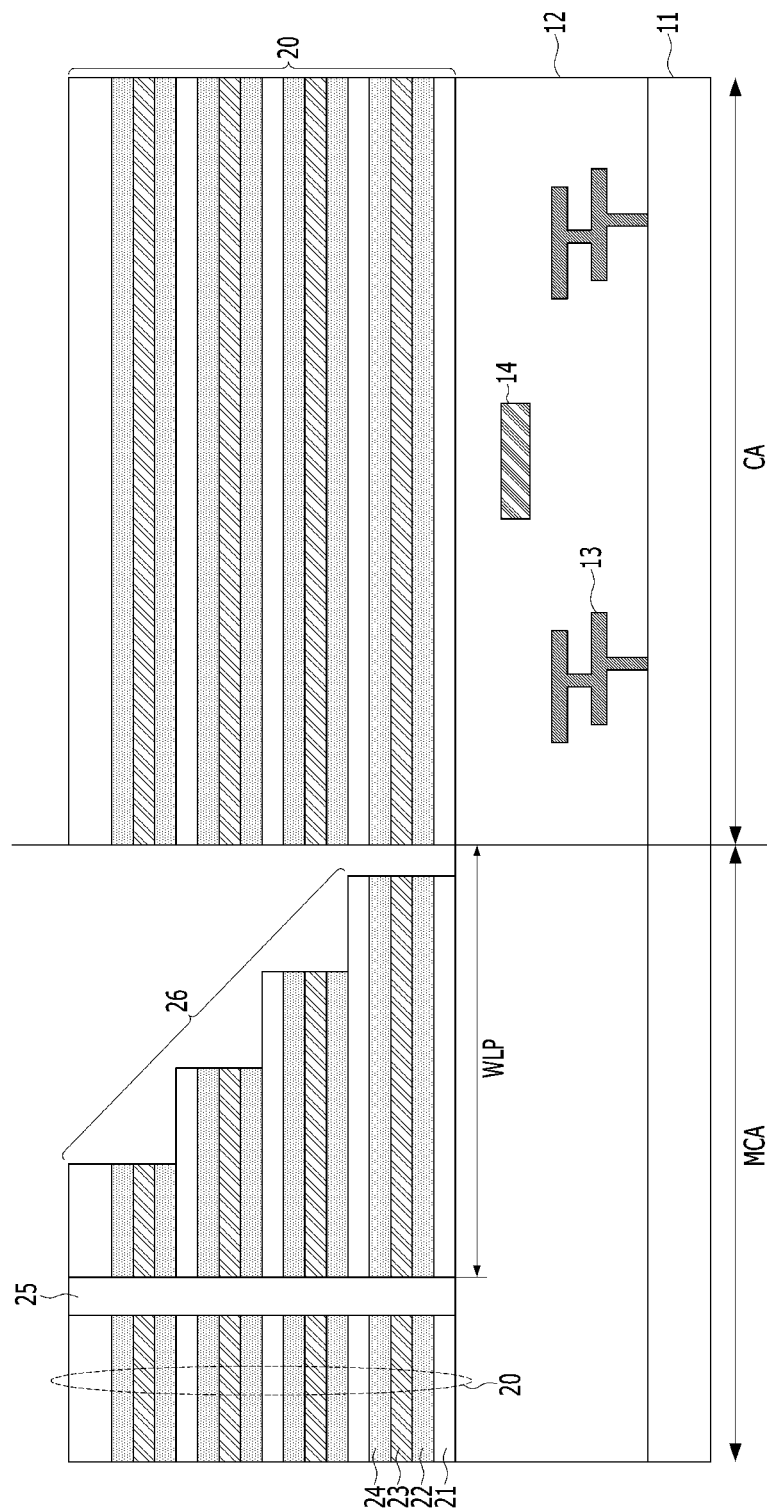

SEMICONDUCTOR MEMORY DEVICE AND METHOD FOR FABRICATING THE SAME

CROSS-REFERENCE TO RELATED APPLICATIONS

The present application claims priority of Korean Patent Application No. 10-2021-0064836, filed on May 20, 2021, which is incorporated herein by reference in its entirety.

BACKGROUND

1. Field

Various embodiments of the present invention relate to a semiconductor device, and more particularly, to a semiconductor device including three-dimensional memory cells, and a method for fabricating the semiconductor device.

2. Description of the Related Art

As the integration degree of a two-dimensional semiconductor memory device is mainly determined by the area occupied by a unit memory cell, it is greatly affected by the level of a fine pattern forming technique. The integration degree of a 2D semiconductor memory device is increasing, but since the pattern miniaturization requires ultra-expensive equipment, the increase in the integration degree of a 2D semiconductor memory device is still limited. To address this concern, three-dimensional semiconductor memory devices including memory cells that are arranged in three dimensions are being suggested.

SUMMARY

Embodiments of the present invention are directed to a semiconductor device including highly integrated memory cells, and a method for fabricating the semiconductor device.

In accordance with one embodiment of the present invention, a semiconductor memory device includes: a peripheral circuit portion including an interconnection; a first word line stack and a second word line stack that are spaced apart from each other over the peripheral circuit portion, the first and second word line stacks including a plurality of word lines, respectively; an alternating stack of a plurality of dielectric layers that are positioned over the peripheral circuit portion and disposed between the first word line stack and the second word line stack; a first contact plug penetrating the alternating stack to be coupled to the interconnection; a second contact plug coupled to the word lines of the first and second word line stacks; a first line-shape supporter between the first word line stack and the alternating stack, and extending vertically from the peripheral circuit portion; and a second line-shape supporter between the second word line stack and the alternating stack, and extending vertically from the peripheral circuit portion.

In accordance with another embodiment of the present invention, a method for fabricating a semiconductor memory device includes: forming a peripheral circuit portion including an interconnection over a substrate; forming line-shaped alternating stacks which include stepped pads positioned in a memory cell array region of the peripheral circuit and not overlapping a contact region of the peripheral circuit portion, and which include a dielectric layer, a first sacrificial layer, a semiconductor layer, and a second sacrificial layer that are alternately stacked in a mentioned order; forming a plurality of supporters that support sidewalls of the stepped pads; replacing the first and second sacrificial layers with word lines that are paired with the semiconductor layer interposed therebetween; forming a first contact plug that is coupled to the interconnection; and forming a second contact plug that is coupled to an edge portion of each of the word lines.

In accordance with yet another embodiment of the present invention, a semiconductor memory device includes: a peripheral circuit portion including an interconnection; an alternating stack of a plurality of dielectric layers that are positioned over the peripheral circuit portion; first contact plugs penetrating the alternating stack to be coupled to the interconnection; two neighboring stepped word line pad stack pairs with the alternating stack interposed therebetween; second contact plugs that are respectively coupled to the word line pad stack pairs; and line-shape supporters that are positioned between the word line pad stack pairs and the alternating stack.

BRIEF DESCRIPTION OF THE DRAWINGS

FIGS. 8A to 8I are cross-sectional views illustrating a method for fabricating a semiconductor memory device in accordance with one embodiment of the present invention.

DETAILED DESCRIPTION

Figure 1:
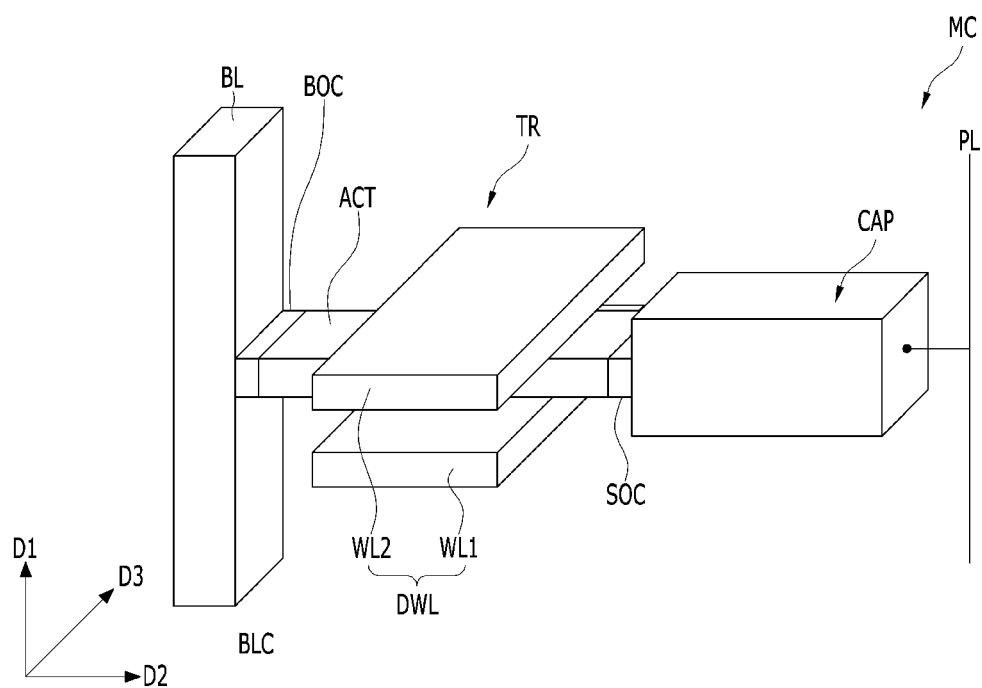
FIG. 1 is a perspective view schematically illustrating a unit memory cell of a semiconductor memory device in accordance with one embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
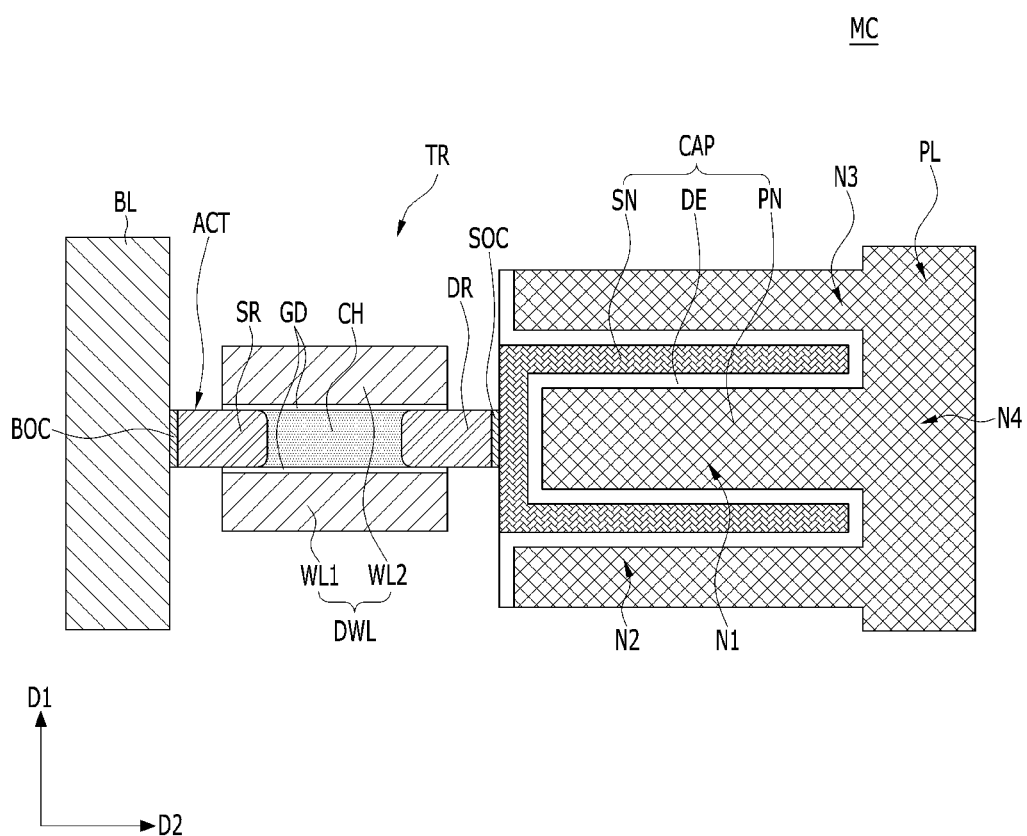
FIG. 2 is a cross-sectional view illustrating the memory cell shown in FIG. 1.

FIG. 1 is a perspective view schematically illustrating a unit memory cell of a semiconductor memory device in accordance with one embodiment of the present invention. FIG. 2 is a cross-sectional view illustrating the memory cell shown in FIG. 1.

Referring to FIGS. 1 and 2, a unit memory cell MC of a three-dimensional (3D) semiconductor memory device in accordance with embodiments of the present invention may include a bit line BL, a transistor TR, and a capacitor CAP. The transistor TR may include an active layer ACT, a gate dielectric layer GD, and a double word line DWL. The capacitor CAP may include a storage node SN, a dielectric layer DE, and a plate node PN. The bit line BL may have a pillar shape extending in a first direction D1. The active layer ACT may have a bar shape extending in a second direction D2 intersecting with the first direction D1. The double word line DWL may have a line shape extending in a third direction D3 intersecting with the first direction D1 and the second direction D2. The plate node PN of the capacitor CAP may be coupled to the plate line PL.

The bit line BL may be vertically oriented in the first direction D1. The bit line BL may be referred to as a vertically aligned bit line or a pillar-type bit line. The bit line BL may include a conductive material. The bit line BL may include a silicon-based material, a metal-based material, or a combination thereof. The bit line BL may include for example polysilicon, a metal, a metal nitride, a metal silicide, or a combination thereof. The bit line BL may include polysilicon, titanium nitride, tungsten, or a combination thereof. For example, the bit line BL may include polysilicon or titanium nitride (TiN) doped with an N-type impurity. The bit line BL may include a stack (TiN/W) of titanium nitride and tungsten.

The transistor TR may include an active layer ACT, a gate dielectric layer GD, and a double word line DWL (WL1, WL2). The double word line DWL may extend in the third direction D3, and the active layer ACT may extend in the second direction D2. The active layer ACT may be laterally arranged from the bit line BL. The double word line DWL may include a first word line WL1 and a second word line WL2. The first word line WL1 and the second word line WL2 may face each other with the active layer ACT interposed therebetween. A gate dielectric layer GD may be formed on the upper and lower surfaces of the active layer ACT.

The active layer ACT may include a semiconductor material or an oxide semiconductor. For example, the active layer ACT may include silicon, germanium, silicon-germanium, or indium gallium zinc oxide (IGZO). The active layer ACT may include a thin-body channel CH, a first source/drain region SR between the thin-body channel CH and the bit line BL, and a second source/drain region DR between the thin-body channel CH and the capacitor CAP.

The first source/drain region SR and the second source/drain region DR may be doped with impurities of the same conductivity type. The first source/drain region SR and the second source/drain region DR may be doped with an N-type impurity or a P-type impurity. The first source/drain region SR and the second source/drain region DR may include at least one impurity selected from a group including arsenic (As), phosphorus (P), boron (B), indium (In), and combinations thereof. A first side of the first source/drain region SR may contact the bit line BL, and a second side of the first source/drain region SR may contact the thin-body channel CH. A first side of the second source/drain region DR may contact the storage node SN, and a second side of the second source/drain region DR may contact the thin-body channel CH. The second side of the first source/drain region SR and the second side of the second source/drain region DR may partially overlap with a side of the first word line WL1 and a side of the second word line WL2, respectively. A lateral length of the thin-body channel CH in the second direction D2 may be smaller than lateral lengths of the first and second source/drain regions SR and DR in the second direction D2. According to another embodiment of the present invention, the lateral length of the thin-body channel CH in the second direction D2 may be greater than the lateral lengths of the first and second source/drain regions SR and DR in the second direction D2.

The transistor TR may be a cell transistor, and it may have a double word line DWL. In the double word line DWL, the first word line WL1 and the second word line WL2 may have the same potential. For example, the first word line WL1 and the second word line WL2 may form a pair to be coupled to one memory cell MC. The same word line driving voltage may be applied to the first word line WL1 and the second word line WL2. As described, the memory cell MC in accordance with one embodiment of the present invention may have a double word line DWL in which two word lines, which are the first and second word lines WL1 and WL2, are disposed adjacent to one thin-body channel CH.

In one embodiment, the active layer ACT may have a thickness smaller than the thicknesses of the first and second word lines WL1 and WL2. To be specific, a vertical thickness of the active layer ACT in the first direction D1 may be smaller than a vertical thickness of each of the first and second word lines WL1 and WL2 in the first direction D1. As such, the thin active layer ACT may be referred to as a thin-body active layer. The thin active layer ACT may include the thin-body channel CH, and a thickness of the thin-body channel CH may be approximately 10 nm or less. According to another embodiment of the present invention, the thin-body channel CH may have the same vertical thickness as the first and second word lines WL1 and WL2.

The upper and lower surfaces of the active layer ACT may have a flat-surface. In other words, the upper and lower surfaces of the active layer ACT may be parallel to each other in the second direction D2.

The gate dielectric layer GD may include for example silicon oxide, silicon nitride, a metal oxide, a metal oxynitride, a metal silicate, a high-k material, a ferroelectric material, an anti-ferroelectric material or a combination thereof. The gate dielectric layer GD may include for example $SiO_2$, $Si_3N_4$, $HfO_2$, $Al_2O_3$, $ZrO_2$, AlON, HfON, HfSiO, HfSiON, or the like.

Each of the first and second word lines WL1 WL2 of the double word line DWL may include a metal, a metal mixture, a metal alloy, or a semiconductor material. The double word line DWL may include titanium nitride, tungsten, polysilicon, or a combination thereof. For example, the double word line DWL may include a TiN/W stack in which titanium nitride and tungsten are sequentially stacked. The double word line DWL may include an N-type work function material or a P-type work function material. The N-type work function material may have a low work function of approximately 4.5 eV or less, and the P-type work function material may have a high work function of approximately 4.5 eV or more.

According to one embodiment of the present invention, in the double word line DWL, the first word line WL1 and the second word line WL2 may form a pair with the active layer ACT interposed therebetween. The double word line DWL may be coupled to one memory cell MC.

A bit line side-ohmic contact BOC may be formed between the first source/drain region SR and the bit line BL. The bit line side-ohmic contact BOC may have a height and a width that fully cover the end of the first source/drain region SR adjacent the bit line. The bit line side-ohmic contact BOC may be formed by deposition and annealing of a metal layer. For example, it may be formed as the metal of the metal layer reacts with silicon of the first source/drain region SR. The bit line side-ohmic contact BOC may include a metal silicide. The bit line side-ohmic contact BOC may include titanium silicide, cobalt silicide, nickel silicide, or the like.

The capacitor CAP may be disposed laterally in the second direction D2 from the transistor TR. The capacitor CAP may include the storage node SN extending laterally from the active layer ACT in the second direction D2. The capacitor CAP may further include a dielectric layer DE and a plate node PN over the storage node SN. The storage node SN, the dielectric layer DE, and the plate node PN may be arranged laterally in the second direction D2. The storage node SN may have a laterally oriented cylindrical shape. The dielectric layer DE may conformally cover the cylindrical inner wall and the cylindrical outer wall of the storage node SN. The plate node PN may have a shape extending into the cylindrical inner wall and surrounding the cylindrical outer wall of the storage node SN over the dielectric layer DE. The plate node PN may be coupled to the plate line PL. The storage node SN may be electrically connected to the second source/drain region DR.

The storage node SN may have a three-dimensional structure, and the storage node SN of the three-dimensional structure may have a lateral three-dimensional structure which is oriented in the second direction D2. As an example of the three-dimensional structure, the storage node SN may have a cylindrical shape. According to another embodiment of the present invention, the storage node SN may have a pillar shape or a pylinder shape. A pylinder shape refers to a structure in which a pillar shape and a cylindrical shape are merged. The uppermost surface of the storage node SN may be positioned at the same level as the uppermost surface of the first word line WL1. The lowermost surface of the storage node SN may be positioned at the same level as the lowermost surface of the second word line WL2.

The plate node PN may include an internal node N1 and external nodes N2, N3, and N4. The internal node N1 and the external nodes N2, N3, and N4 may be interconnected to each other. The internal node N1 may be positioned in the cylindrical inside of the storage node SN. The external nodes N2 and N3 may be positioned in the cylindrical outside of the storage node SN with the dielectric layer DE interposed therebetween. The external node N4 may interconnect the internal node N1 and the external nodes N2 and N3 to each other. The external nodes N2 and N3 may be positioned to surround the cylindrical outer wall of the storage node SN. The external node N4 may serve as a plate line PL.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a stack of titanium nitride/tungsten (TiN/W), a stack of tungsten nitride/tungsten (WN/W). The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the storage node SN, and titanium nitride (TiN) may be used for the plate node PN of the capacitor CAP, and tungsten nitride may be a low-resistance material.

The dielectric layer DE may include for example silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of a zirconium-based oxide (Zr-based oxide). The dielectric layer DE may have a stacked structure including zirconium oxide ($ZrO_2$). The stacked structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide-based layer ($ZrO_2$-based layer). According to another embodiment of the present invention, the dielectric layer DE may be formed of hafnium-based oxide (Hf-based oxide). The dielectric layer DE may have a stacked structure including hafnium oxide ($HfO_2$). The stacked structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide-based layer ($HfO_2$-based layer). In the ZA stack, ZAZ stack, HA stack, and HAH stack, aluminum oxide ($Al_2O_3$) may have a greater band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high band-gap material having a greater band gap than the high-k material. The dielectric layer DE may include silicon oxide ($SiO_2$) as another high band-gap material other than aluminum oxide ($Al_2O_3$). Since the dielectric layer DE includes a high band-gap material, leakage current may be suppressed. The high band-gap material may be thinner than the high-k material. According to another embodiment of the present invention, the dielectric layer DE may include a laminated structure in which a high-k material and a high band-gap material are alternately stacked. For example, the dielectric layer DE may include ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$).

According to another embodiment of the present invention, the dielectric layer DE may include a stacked structure, a laminated structure, or a mixed structure including zirconium oxide, hafnium oxide, and aluminum oxide.

According to another embodiment of the present invention, an interface control layer for improving leakage current may be further formed between the storage node SN and the dielectric layer DE. The interface control layer may include titanium oxide ($TiO_2$). The interface control layer may also be formed between the plate node PN and the dielectric layer DE.

The capacitor CAP may include a Metal-Insulator-Metal (MIM) capacitor. The storage node SN and the plate node PN may include a metal-based material.

The capacitor CAP may be replaced with another data storage material. For example, the data storage material may be a phase-change material, a magnetic tunnel junction (MTJ), or a variable resistance material.

A storage node side-ohmic contact SOC may be formed between the second source/drain region DR and the storage node SN. The storage node side-ohmic contact SOC may have a height and a width that fully cover the end of the second source/drain region DR adjacent the capacitor CAP. The storage node side-ohmic contact SOC may be formed by depositing a metal layer and performing an annealing process. For example, the storage node side-ohmic contact SOC may be formed by reacting the metal of the metal layer with the silicon of the second source/drain region DR. The storage node side-ohmic contact SOC may include a metal silicide. The storage node side-ohmic contact SOC may include titanium silicide, cobalt silicide, nickel silicide, or the like.

Figure 3:
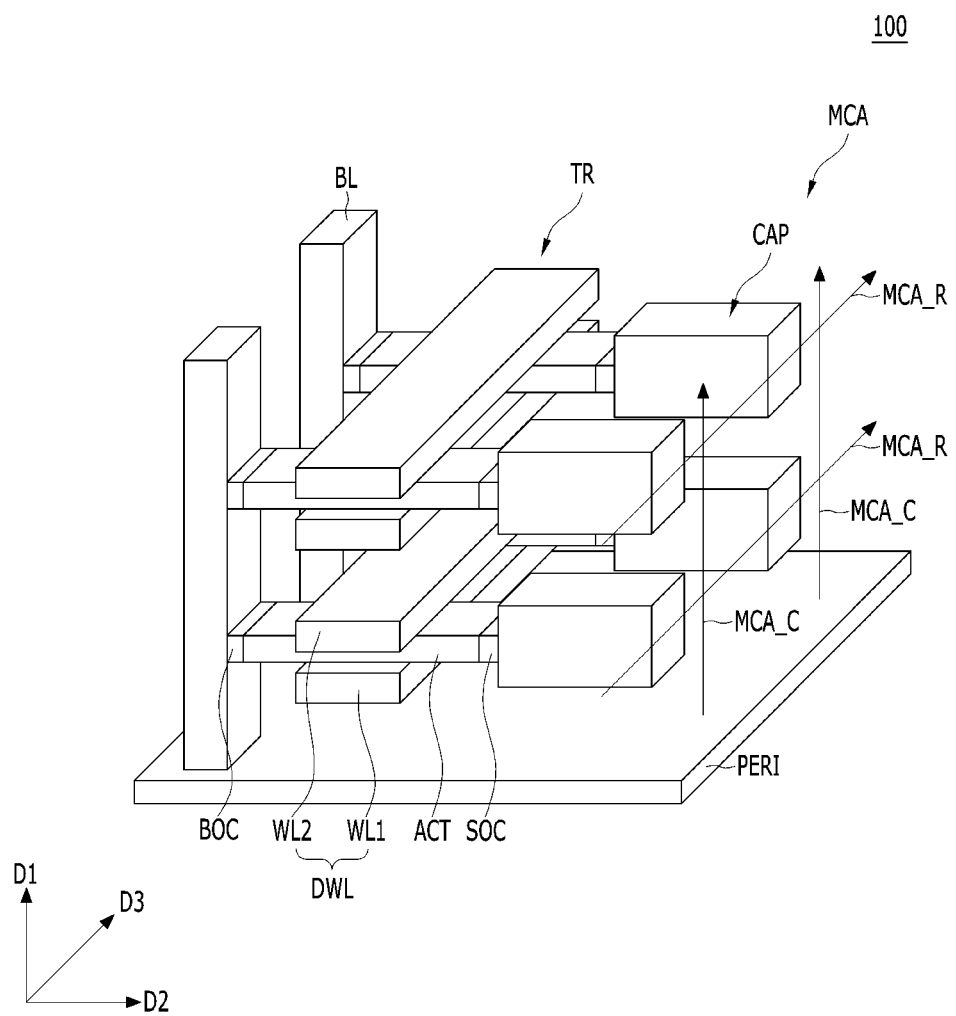
FIG. 3 is a perspective view schematically illustrating a semiconductor memory device in accordance with one embodiment of the present invention.
Figure 4:
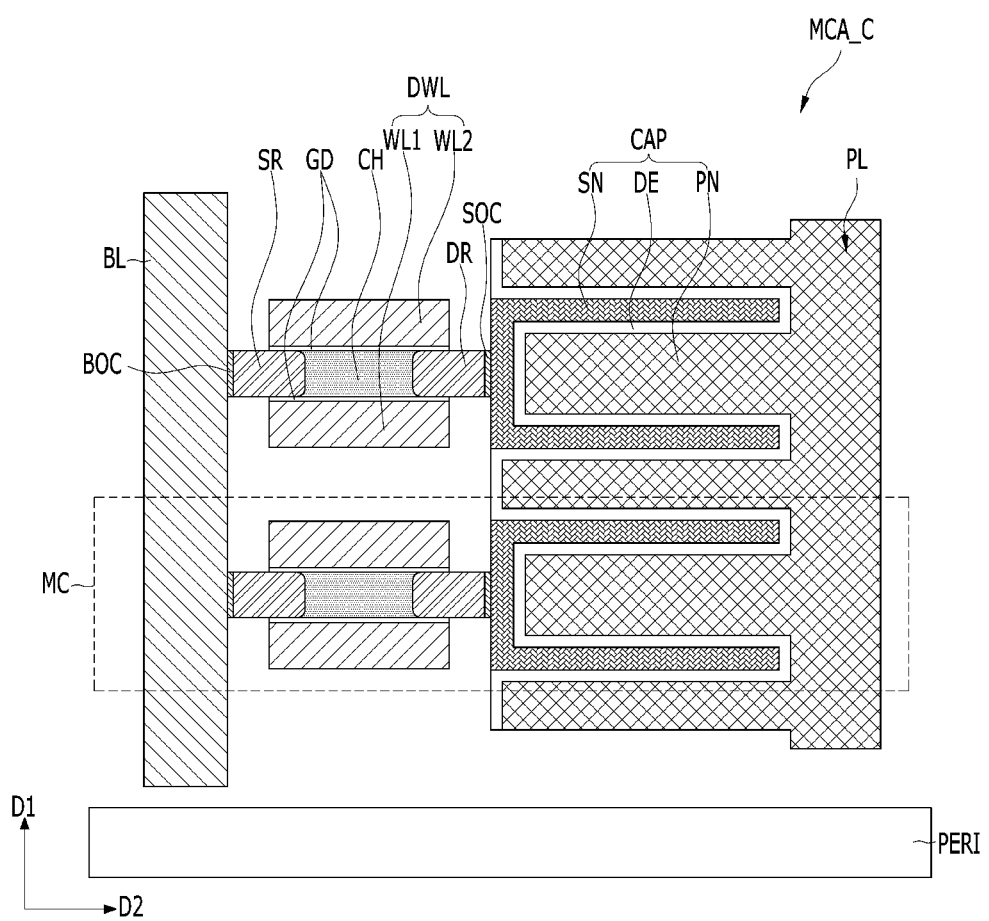
FIG. 4 is a cross-sectional view illustrating a vertical memory cell array MCA_C shown in FIG. 3.

FIG. 3 is a perspective view schematically illustrating a semiconductor memory device in accordance with one embodiment of the present invention. FIG. 4 is a cross-sectional view illustrating a vertical memory cell array MCA_C shown in FIG. 3.

Referring to FIGS. 3 and 4, the semiconductor memory device 100 may include a memory cell array MCA. The memory cells MC of FIG. 1 may be arranged in the first to third directions D1, D2 and D3 to form a multi-layered memory cell array MCA. The memory cell array MCA may include a three-dimensional array of memory cells MC, and the three-dimensional memory cell array may include a vertical memory cell array MCA_C and a lateral memory cell array MCA_R. The vertical memory cell array MCA_C refers to an array of memory cells MC that are vertically arranged in the first direction D1. The lateral memory cell array MCA_R refers to an array of memory cells MC that are arranged laterally in the third direction D3. The vertical memory cell array MCA_C may be referred to as a column array of memory cells MC, and the lateral memory cell array MCA_R may be referred to as a row array of memory cells MC. The bit line BL may be vertically oriented to be coupled to the vertical memory cell array MCA_C, and the double word line DWL may be laterally oriented to be coupled to the lateral memory cell array MCA_R. The bit line BL coupled to the vertical memory cell array MCA_C may be referred to as a common bit line, and the vertical memory cell arrays MCA_C that are neighboring in the third direction D3 may be coupled to different common bit lines. The double word line DWL coupled to the lateral memory cell array MCA_R may be referred to as a common double word line DWL, and the lateral memory cell arrays MCA_R that are neighboring in the first direction D1 may be coupled to different common double word lines.

The memory cell array MCA may include a plurality of memory cells MC, and each memory cell MC may include a vertically oriented bit line BL, a laterally oriented active layer ACT, and a double word line DWL, and a laterally oriented capacitor CAP. FIG. 3 illustrates a three-dimensional memory cell array which includes four memory cells MC.

One bit line BL may contact the active layers ACT that are neighboring in the first direction D1. The active layers ACT that are neighboring in the third direction D3 may share a double word line DWL. The capacitors CAP may be coupled to the active layers ACT, respectively. The capacitors CAP may share one plate line PL. The individual active layers ACT may be thinner than the first and second word lines WL1 and WL2 of the double word line DWL.

In the memory cell array MCA shown in FIG. 3, two double word lines DWL may be vertically stacked in the first direction D1. Each double word line DWL may include a pair of a first word line WL1 and a second word line WL2. Between the first word line WL1 and the second word line WL2, a plurality of active layers ACT may be laterally arranged to be spaced apart from each other in the second direction D2. The thin-body channel CH of the active layer ACT may be positioned between the first word line WL1 and the second word line WL2.

The semiconductor memory device 100 may further include a substrate PERI, and the substrate PERI may include a peripheral circuit portion. Hereinafter, the substrate PERI will be simply referred to as a peripheral circuit portion PERI. The bit line BL of the memory cell array MCA may be oriented perpendicular to the surface (the upper surface or the lower surface) of the peripheral circuit portion PERI, and the double word line DWL may be oriented parallel to the surface of the peripheral circuit portion PERI.

Figure 5:
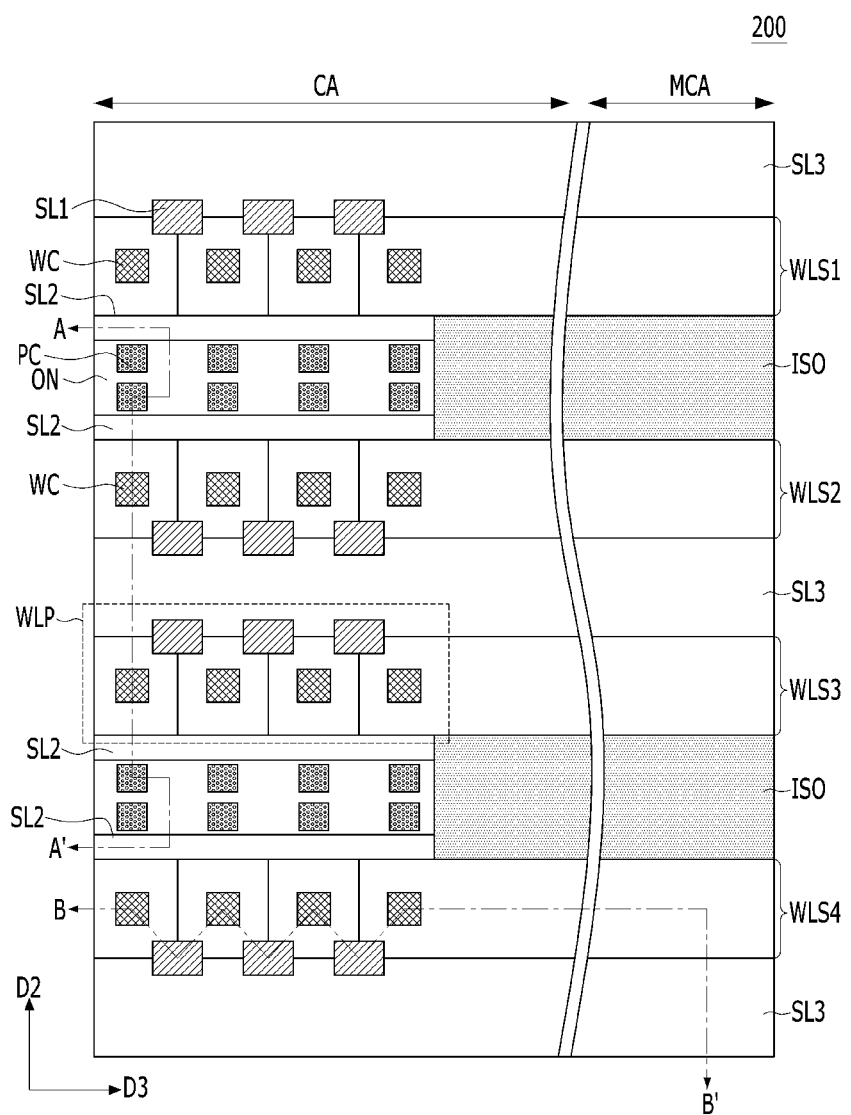
FIG. 5 is a plan view illustrating a semiconductor memory device in accordance with another embodiment of the present invention.
Figure 6:
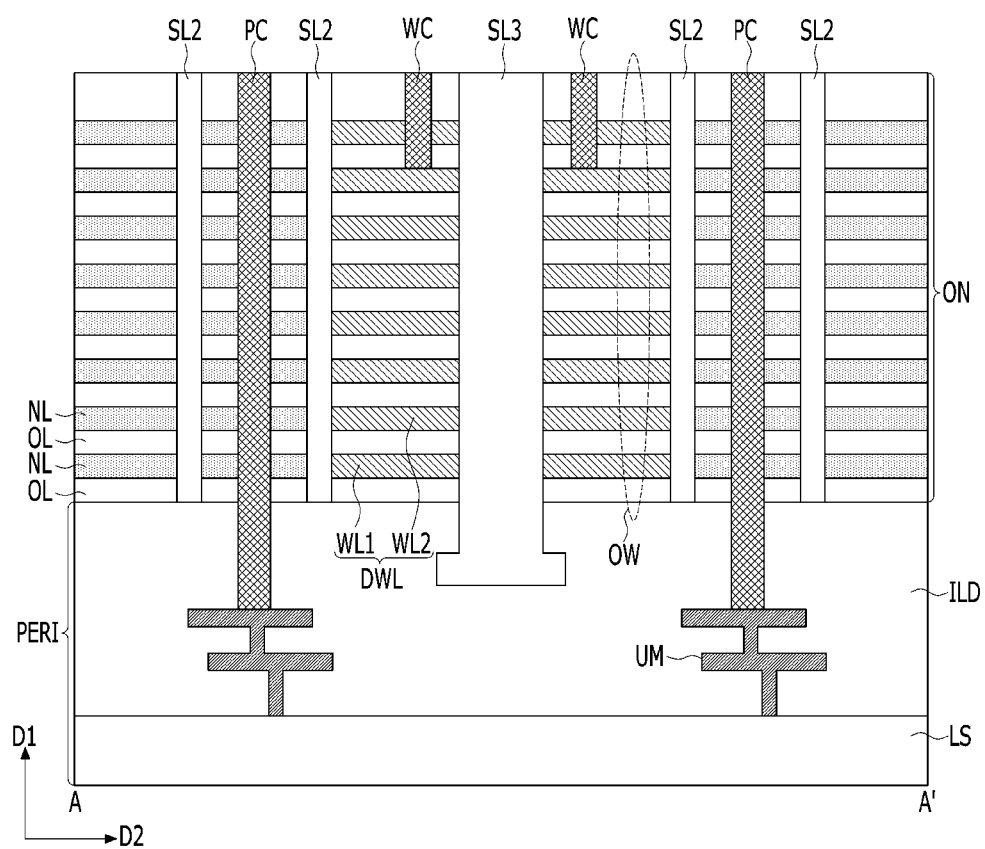
FIG. 6 is a cross-sectional view taken along a line A-A' shown in FIG. 5.
Figure 7:
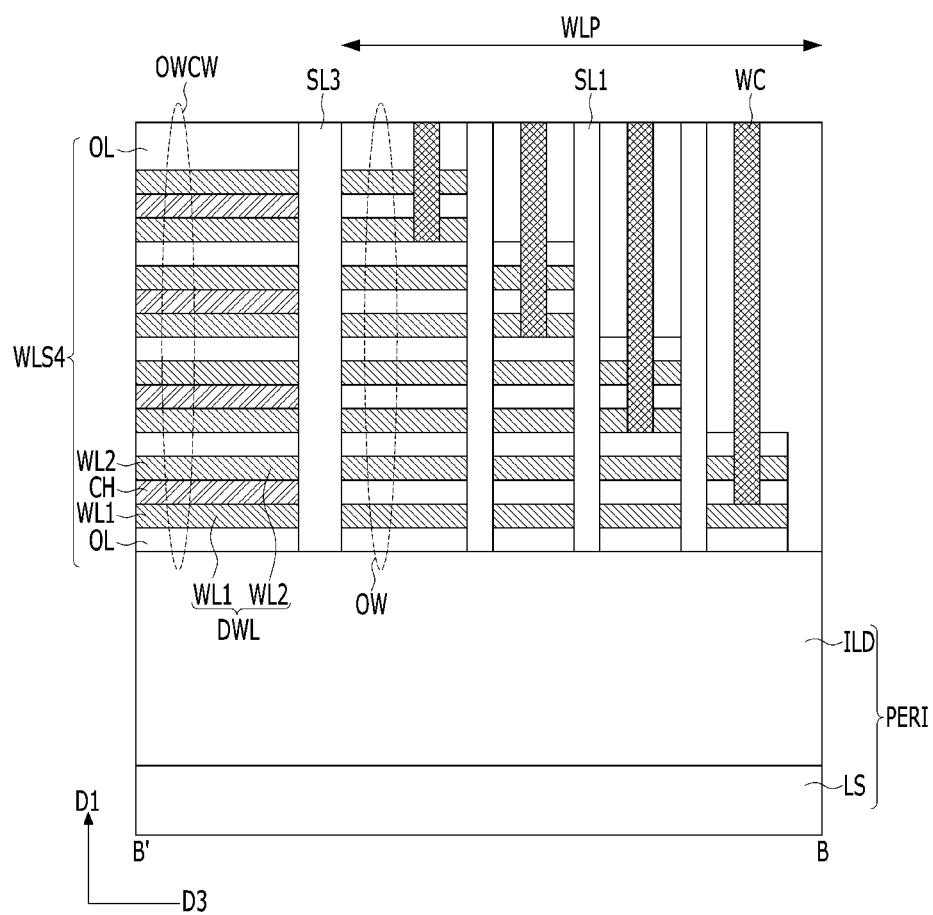
FIG. 7 is a cross-sectional view taken along a line B-B' shown in FIG. 5.

FIG. 5 is a plan view illustrating a semiconductor memory device in accordance with another embodiment of the present invention. FIG. 6 is a cross-sectional view taken along a line A-A' shown in FIG. 5. FIG. 7 is a cross-sectional view taken along a line B-B' shown in FIG. 5.

Referring to FIGS. 5 to 7, the semiconductor memory device 200 may include a peripheral circuit portion PERI, a memory cell array MCA, and a contact region CA. The memory cell array MCA may be an array of memory cells MC. As for the descriptions on the memory cells MC and the memory cell array MCA, FIGS. 1 to 4 may be referred to.

The memory cell array MCA and the contact region CA may be positioned at a higher level than the peripheral circuit portion PERI. The peripheral circuit portion PERI may include interconnections UM disposed above the semiconductor substrate LS. The interconnections UM may be coupled to at least one control circuit which is formed in the semiconductor substrate LS. The at least one control circuit may include a plurality of transistors. The interconnections UM may be covered with an inter-layer dielectric layer ILD. The peripheral circuit portion PERI may function as a circuit for operating the memory cells of the memory cell array MCA. The bit line BL of the memory cell array MCA may be oriented perpendicular to the surface (the upper surface or the lower surface) of the peripheral circuit portion PERI, and the double word line DWL may be oriented parallel to the surface of the peripheral circuit portion PERI.

The peripheral circuit portion PERI may be positioned at a lower level than the memory cell array MCA. This may be referred to as a COP (Cell-over-Peripheral circuit portion) structure. The peripheral circuit portion PERI may include at least one control circuit for driving the memory cell array MCA. The at least one control circuit of the peripheral circuit portion PERI may include an N-channel transistor, a P-channel transistor, a CMOS circuit, or a combination thereof. The at least one control circuit of the peripheral circuit portion PERI may include an address decoder circuit, a read circuit, a write circuit, and the like. The at least one control circuit of the peripheral circuit portion PERI may include a planar channel transistor, a recess channel transistor, a buried gate transistor, and a Fin channel transistor (FinFET) and the like.

For example, the peripheral circuit portion PERI may include sub-word line drivers and a sense amplifier. The double word line DWL may be coupled to the sub-word line drivers. The bit lines BL may be coupled to the sense amplifier.

The contact region CA may include a plurality of slits SL1, SL2, and SL3. The slits SL1, SL2, and SL3 may include a plurality of first slits SL1, a plurality of second slits SL2, and a plurality of third slits SL3. The first slits SL1, the second slits SL2, and the third slits SL3 may be vertically oriented in the first direction D1.

The memory cell array MCA may include word line stacks WLS1 to WLS4. The word line stacks WLS1 to WLS4 may extend long in the third direction D3. Cell isolation layers ISO and the third slits SL3 may be formed between the neighboring word line stacks WLS1 to WLS4. For example, a cell isolation layer ISO may be positioned between the first word line stack WLS1 and the second word line stack WLS2, and a third slit SL3 may be positioned between the second word line stack WLS2 and the third word line stack WLS3. A cell isolation layer ISO may be positioned between the third word line stack WLS3 and the fourth word line stack WLS4. The third slits SL3 may extend from the memory cell array MCA to the contact region CA. The cell isolation layers ISO may be positioned in the memory cell array MCA.

The word line stacks WLS1 to WLS4 may refer to a structure in which a plurality of double word lines DWL are stacked. Each double word line DWL may include a pair of a first word line WL1 and a second word line WL2.

Each of the word line stacks WLS1 to WLS4 may include a first alternating stack OWCW of dielectric materials and conductive materials. For example, the first alternating stack OWCW may be stacked repeatedly several times in the order of a dielectric layer OL, the first word line WL1, the channel CH, and the second word line WL2. In this embodiment of the present invention, a case where the alternating stacks are repeatedly stacked four times will be described as an example. The dielectric layer OL may include silicon oxide, the channel CH may include polysilicon, and the first and second word lines WL1 and WL2 may include tungsten.

Edge portions of each of the word line stacks WLS1 to WLS4 may extend from the memory cell array MCA to the contact region CA. Edge portions of the word line stacks WLS1 to WLS4 positioned in the contact region CA may be abbreviated as a word line pad stack WLP. The word line pad stacks WLP may be coupled to the word line contacts WC, respectively. The word line pad stacks WLP may be formed in a stepped structure such as shown in FIG. 7. For example, the edge portions of the double word lines DWL may be positioned in a stepped structure. The word line contacts WC may be respectively coupled to the double word lines DWL.

The word line pad stacks WLP may have a stack structure of the dielectric layers OL and the double word lines DWL. When the dielectric layers OL include silicon oxide and the double word lines DWL include tungsten, the word line pad stacks WLP may be an OW stack in which silicon oxide and tungsten are alternated. A part of the word line pad stacks WLP may exist over a region that does not include the channel CH. A gate dielectric layer may be positioned between the double word lines DWL and the channel CH.

A second alternating stack ON is shown in FIGS. 5 and 6 and may be positioned between the word line pad stacks WLP that are neighboring in the second direction D2. For example, the second alternating stack ON may be positioned between the word line pad stack WLP of the first word line stack WLS1 and the word line pad stack WLP of the second word line stack WLS2. The second alternating stack ON may be positioned between the word line pad stack WLP of the third word line stack WLS3 and the word line pad stack WLP of the fourth word line stack WLS4. The second slits SL2 may be positioned between the second alternating stack ON and the word line pad stack WLP. In the second alternating stack ON, a dielectric layer OL and a word line-level dielectric layer NL may be repeatedly stacked several times (as shown on the left side of FIG. 6). The word line-level dielectric layers NL may include silicon nitride, and the dielectric layers OL may include silicon oxide.

A plurality of peripheral contact plugs PC penetrating the second alternating stack ON may be formed. The peripheral contact plugs PC may extend vertically to be coupled to the interconnections UM. The word line contacts WC and the peripheral contact plugs PC may be formed of the same material. The peripheral contact plugs PC may penetrate the second alternating stack ON between the second slits SL2.

A plurality of the first slits SL1 penetrating between the third slits SL3 and the word line pad stacks WLP may be formed. The first slits SL1 and the second slits SL2 being filled with a dielectric may serve to support the word line pad stacks WLP. The first slits SL1 may be referred to as pillar-shape supporters, and the second slits SL2 may be referred to as line-shape supporters. Step-like structures of the double word lines WLP may contact the first slits SL1. The first slits SL1 may penetrate the stepped structures of the double word lines WLP.

In the contact region CA, the bottom surfaces of the third slits SL3 may partially penetrate the inter-layer dielectric layer ILD and may be positioned at a higher level than the interconnection UM.

The peripheral contact plugs PC and the first to third slits SL1, SL2, and SL3 may not contact each other.

FIGS. 8A to 8I are cross-sectional views illustrating a method for fabricating a semiconductor memory device in accordance with one embodiment of the present invention.

Referring to FIG. 8A, interconnections 13 and an inter-layer dielectric layer 12 may be formed over a substrate 11. A transistor may be formed below the interconnections 13, and source/drain of the transistor may be coupled to the interconnections 13. The substrate 11 may include a memory cell array MCA and a contact region CA.

A sacrificial pad 14 may be formed at a higher level than the interconnections 13. The sacrificial pad 14 may serve as an etch stop layer. The sacrificial pad 14 may include a metal material. The interconnections 13 and the sacrificial pad 14 may be positioned in a contact region CA. For example, after the interconnections 13 is formed over the substrate 11, the sacrificial pad 14 may be formed at a level higher than the interconnections 13. The inter-layer dielectric layer 12 may be a stack of a plurality of inter-layer dielectric layers.

An alternating stack 20 may be formed over the inter-layer dielectric layer 12. The alternating stack 20 may include a first dielectric layer 21, a second dielectric layer 22, a semiconductor layer 23, and a third dielectric layer 24 that are stacked several times in the mentioned order. The first dielectric layer 21 may include silicon oxide, and the second dielectric layer 22 and the third dielectric layer 24 may include silicon nitride. The semiconductor layer 23 may include polysilicon. According to one embodiment of the present invention, the alternating stack 20 may be an ONPN stack by alternately stacking silicon oxide-silicon nitride-polysilicon-silicon nitride.

Referring to FIG. 8B, a cell isolation layer 25 penetrating a portion of the alternating stack 20 in the memory cell array MCA may be formed. The cell isolation layer 25 may include silicon oxide. The cell isolation layer 25 may divide the semiconductor layer 23 into a plurality of active layers (or channel layers). For example, referring back to FIG. 3, the multiple active layers ACT may be formed to be separated from each other by the cell isolation layer 25 in the third direction D3.

Subsequently, a step structure 26 may be formed on the edge of the memory cell array MCA, that is, the word line pad stack WLP, by etching the alternating stack 20. The step structure 26 may be formed by repeatedly performing etching and slimming processes using a photoresist. According to one embodiment of the present invention, after the step structure 26 is formed, the cell isolation layer 25 may be formed.

Figure 8C:
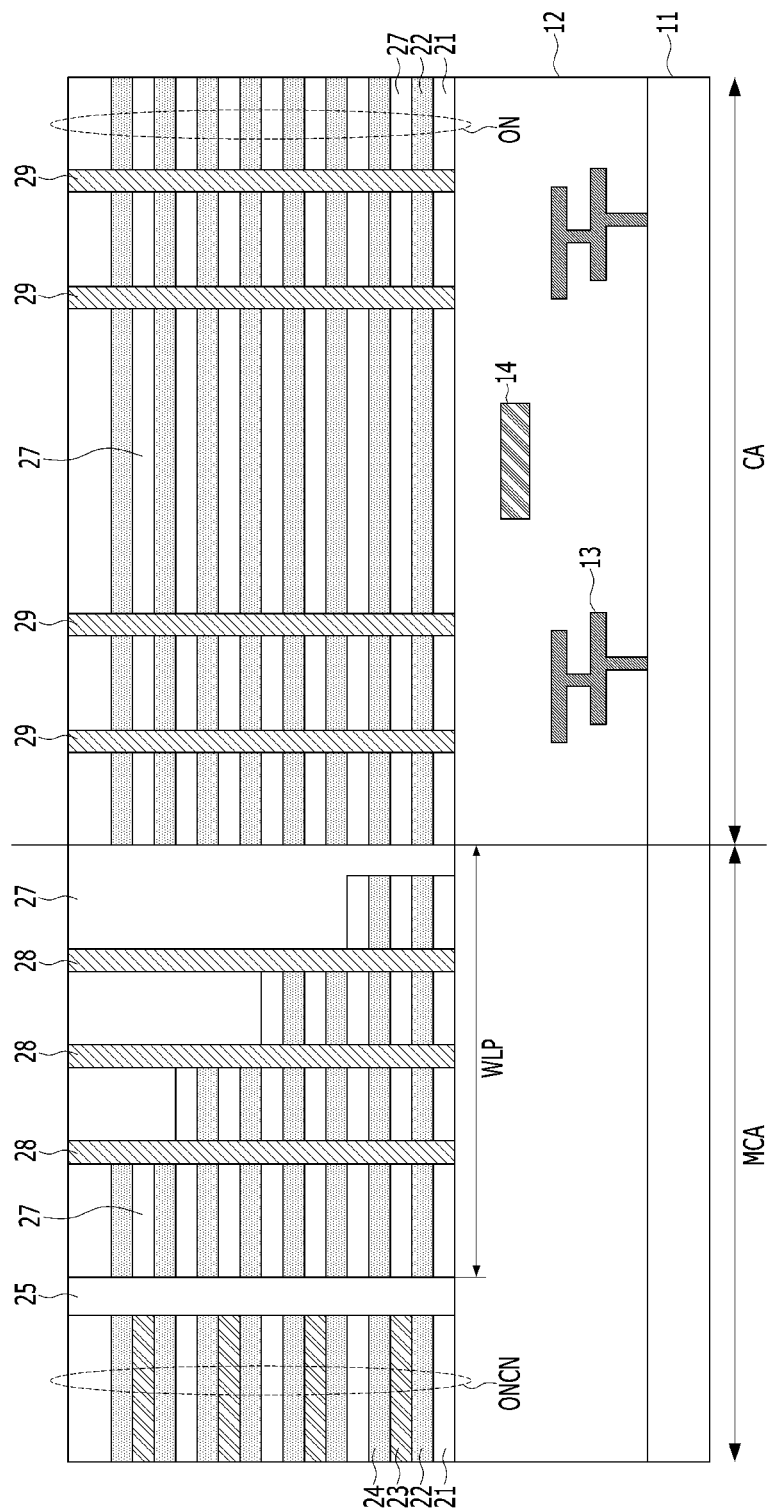

Referring to FIG. 8C, the semiconductor layers 23 may be removed from the step structure 26 and the contact region CA. Hereinafter, the semiconductor layer 23 remaining in the memory cell array MCA may be simply referred to as a channel 23. A first alternating stack ONCN including the first dielectric layer 21, the second dielectric layer 22, the channel 23, and the third dielectric layer 24 may be formed on the memory cell array MCA.

Subsequently, the space from which the semiconductor layers 23 are removed may be filled with a fourth dielectric layer 27. The fourth dielectric layer 27 may cover the step structure 26. The fourth dielectric layer 27 may include silicon oxide. As the fourth dielectric layer 27 is formed, the second alternating stack ON including the first dielectric layer 21, the second dielectric layer 22, the fourth dielectric layer 27, and the third dielectric layer 24 may be formed in the contact region CA. The first dielectric layer 21 and the fourth dielectric layer 27 may include silicon oxide, and the second dielectric layer 22 and the third dielectric layer 24 may include silicon nitride. In the second alternating stack ON, silicon oxides and silicon nitrides may be alternately stacked.

Subsequently, a plurality of pillar-shape supporters 28 penetrating the step structure 26 may be formed. Subsequently, a line-shape supporter 29 penetrating the second alternating stack ON in the contact region CA may be formed. The pillar-shape supporter 28 may correspond to the first slit SL1 shown in FIGS. 5 to 7, and the line-shape supporter 29 may correspond to the second slit SL2 shown in FIGS. 5 to 7. The pillar-shape supporter 28 and the line-shape supporter 29 may include silicon oxide having filled the slits.

Figure 8D:
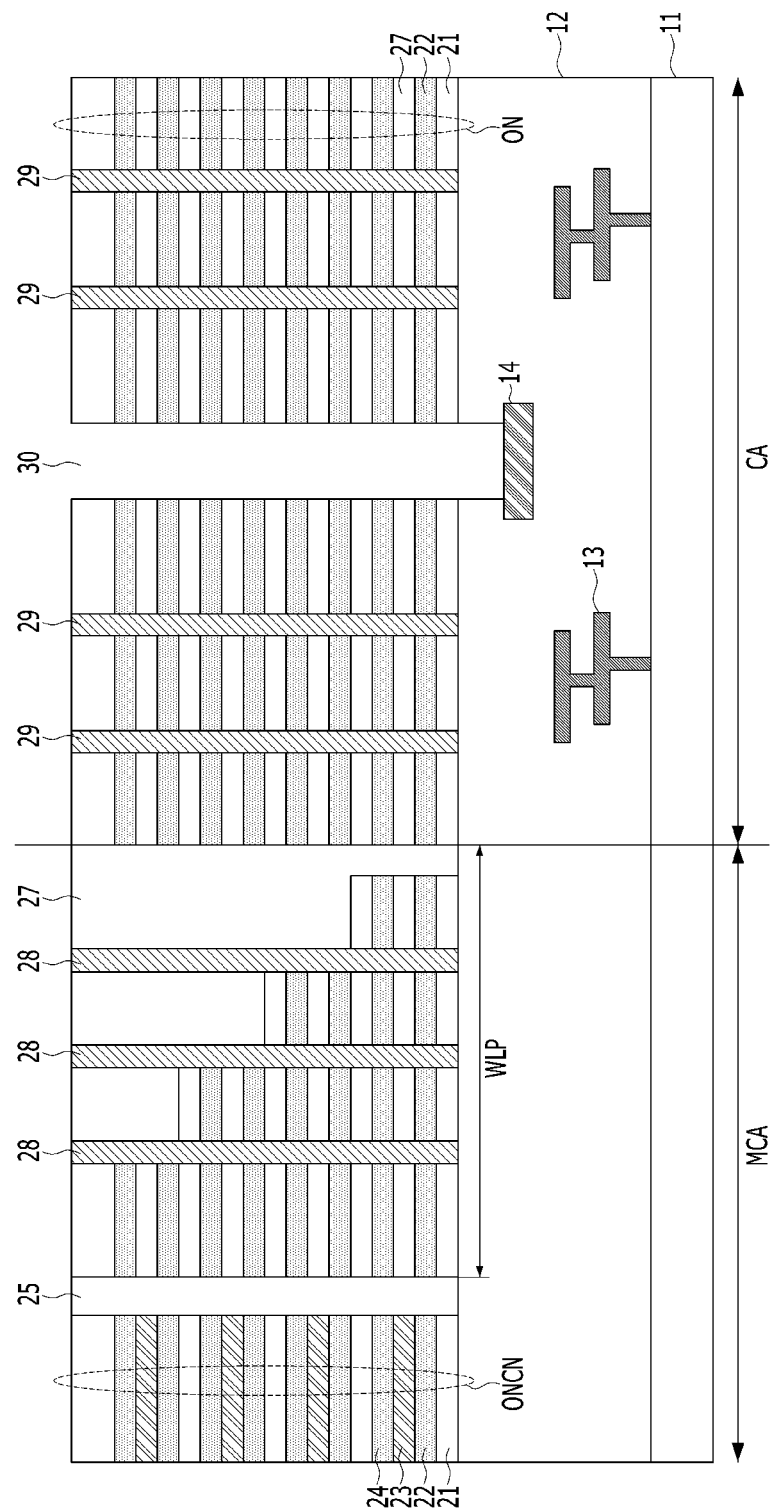

Referring to FIG. 8D, a trench 30 may be formed. The trench 30 may be a structure for separating the neighboring memory cell arrays MCA from each other. A dry etching process may be performed to form the trench 30. The dry etching process may etch the second alternating stack ON, and a portion of the inter-layer dielectric layer 12 may be etched in such a manner that the etching process stops at the sacrificial pad 14. The trench 30 may be a portion filling the third slit SL3 of FIGS. 5 to 7. Accordingly, the trench 30 may extend from the memory cell array MCA to the contact region CA.

Figure 8E:
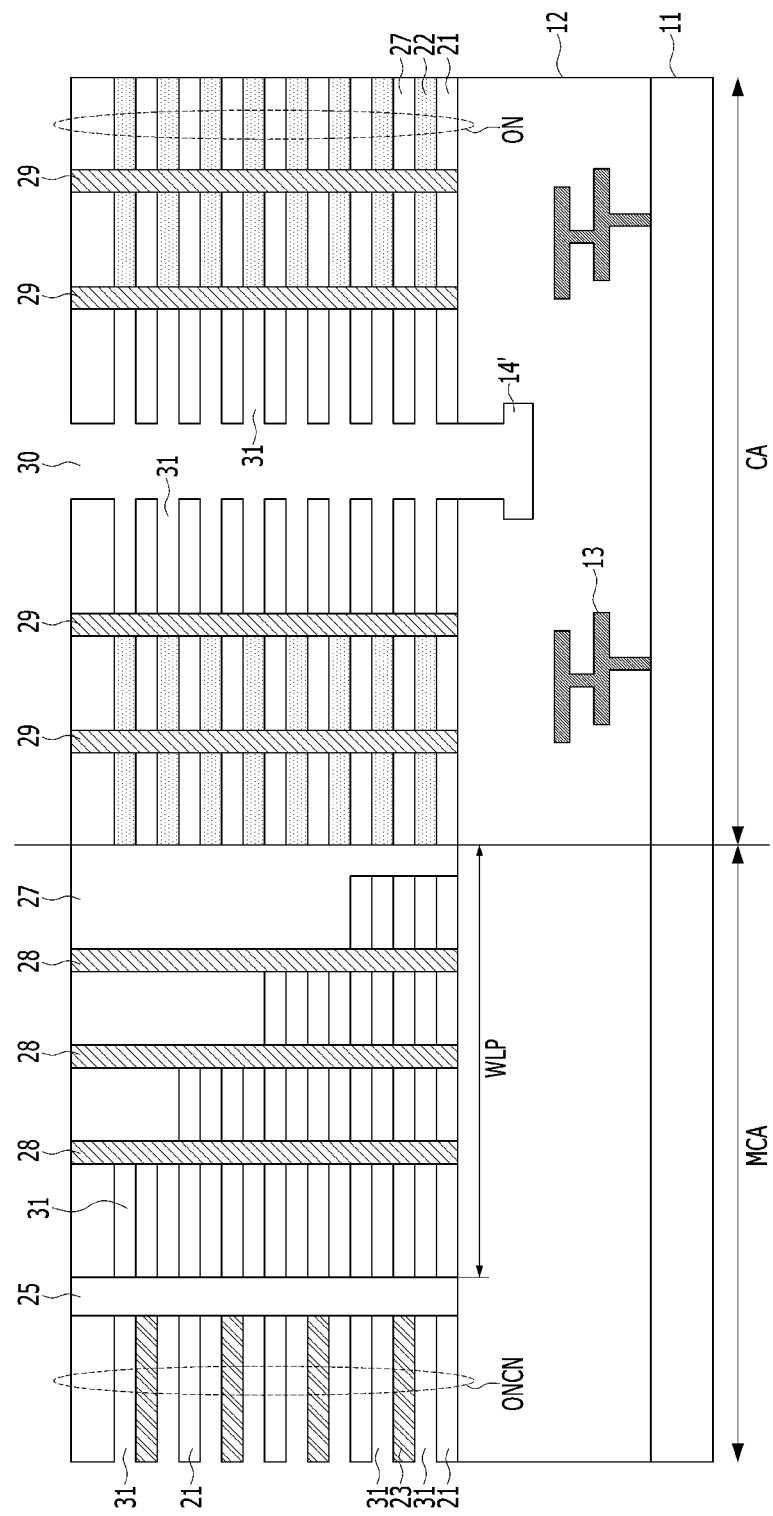

Referring to FIG. 8E, the second dielectric layers 22 and the third dielectric layers 24 may be selectively removed through the trench 30. As a result, in the memory cell array MCA, the recesses 31 may be formed to be positioned vertically with the channel 23 therebetween, and in the contact region CA, the recesses 31 may be formed between the first dielectric layers 21 and the fourth dielectric layers 27. When the second dielectric layers 22 and the third dielectric layers 24 include silicon nitride, a chemical such as phosphoric acid may be used to form the recesses 31.

After the recesses 31 are formed, the sacrificial pad 14 may be selectively removed. The space 14' from which the sacrificial pad 14 is removed may have a greater width than the trench 30.

Figure 8F:
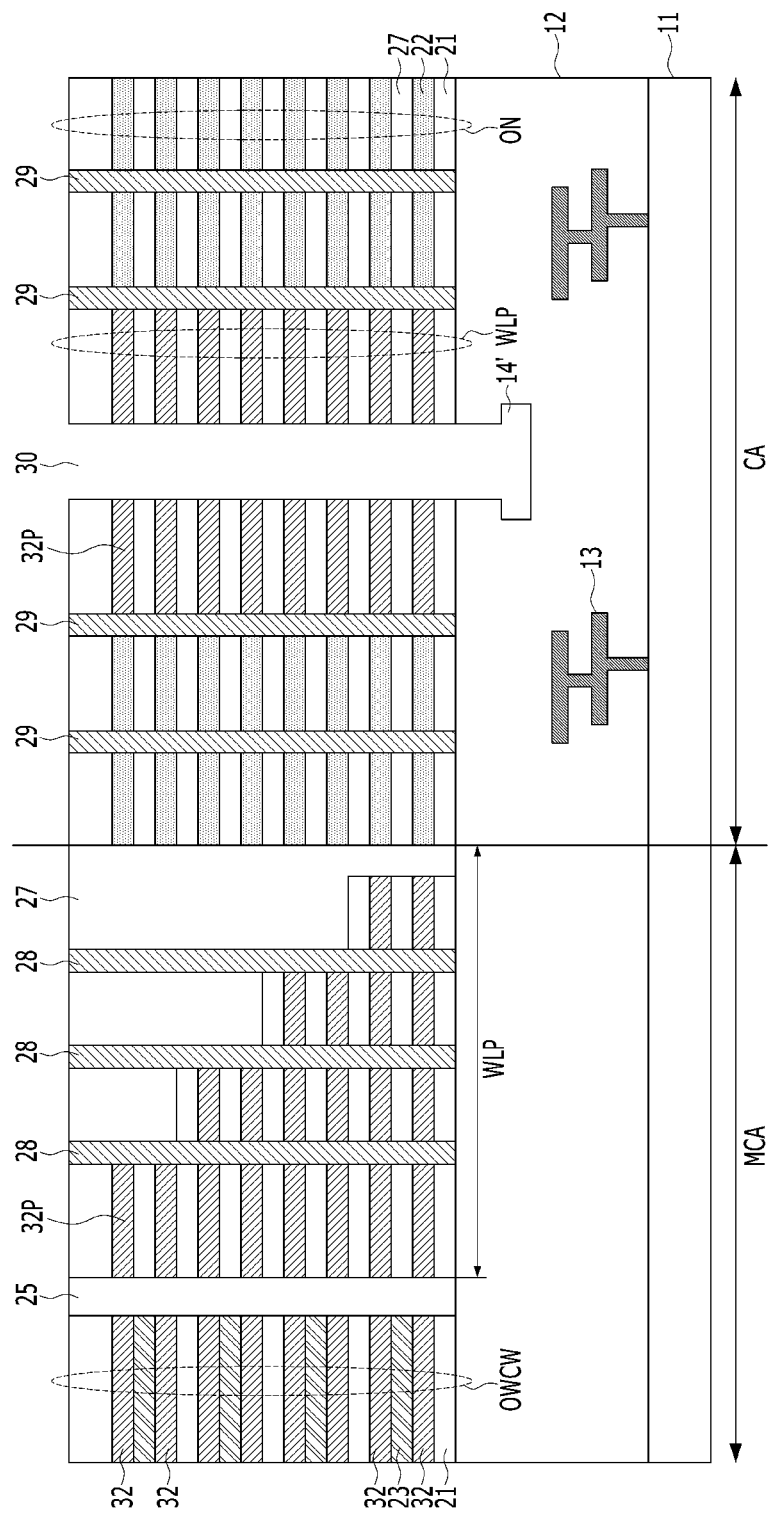

Referring to FIG. 8F, word lines 32 filling the recesses 31 may be formed. Before the word lines 32 are formed, a gate dielectric layer may be formed. The word lines 32 may include titanium nitride, tungsten, or a stack thereof. The word lines 32 may be formed in the memory cell array MCA, and the word lines 32 may extend to the contact region CA. Edge portions of the word lines 32 positioned in the contact region CA, that is, the word line pad stack WLP, may be simply referred to as word line pads 32P.

Figure 8G:
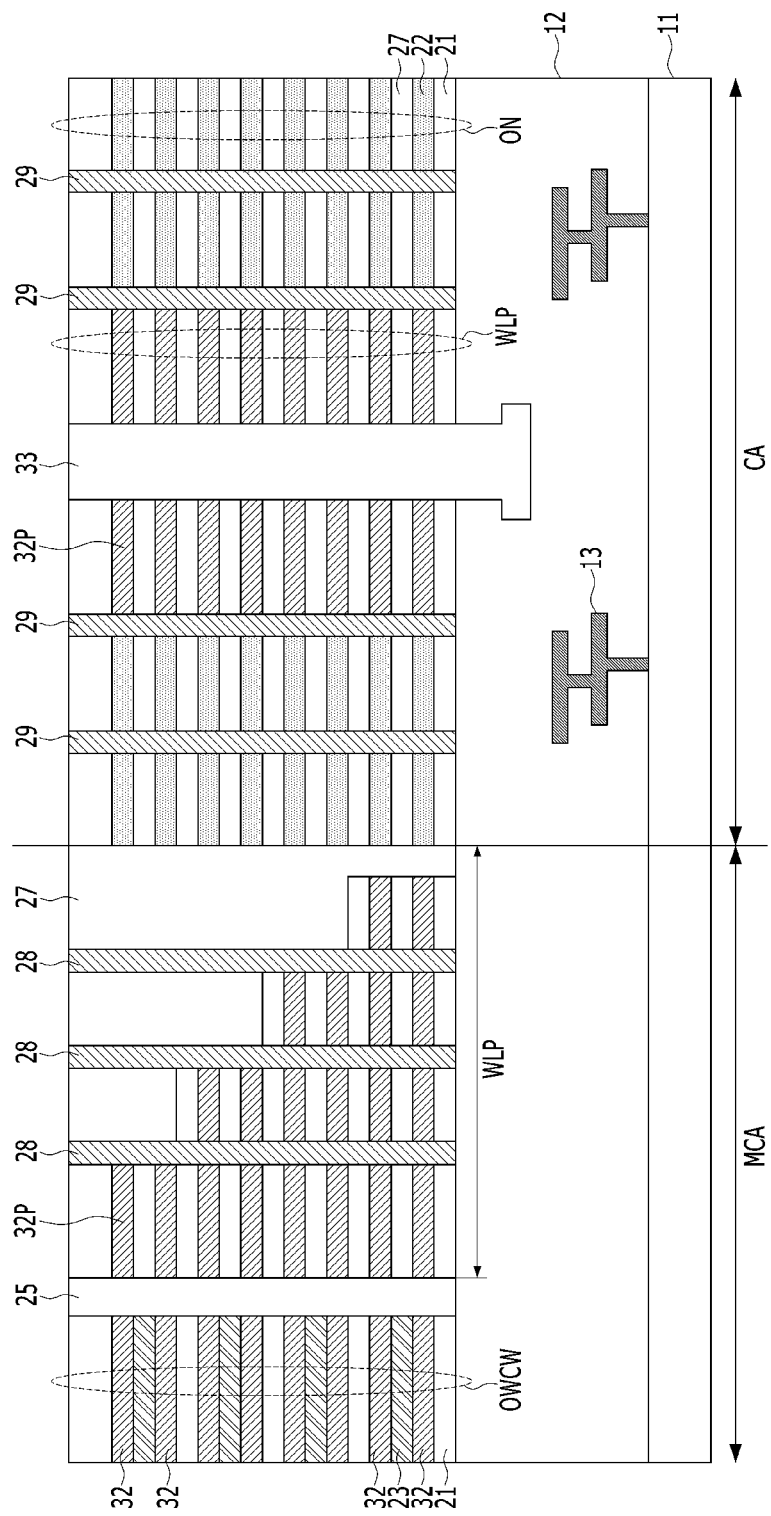

Referring to FIG. 8G, slit 33 containing a dielectric fills the trench 30. The slit 33 may include silicon oxide as the dielectric. The neighboring word lines 32 may be separated from each other by the filled slit 33. The slit 33 may also fill the space 14' from which the sacrificial pad is removed.

Figure 8H:
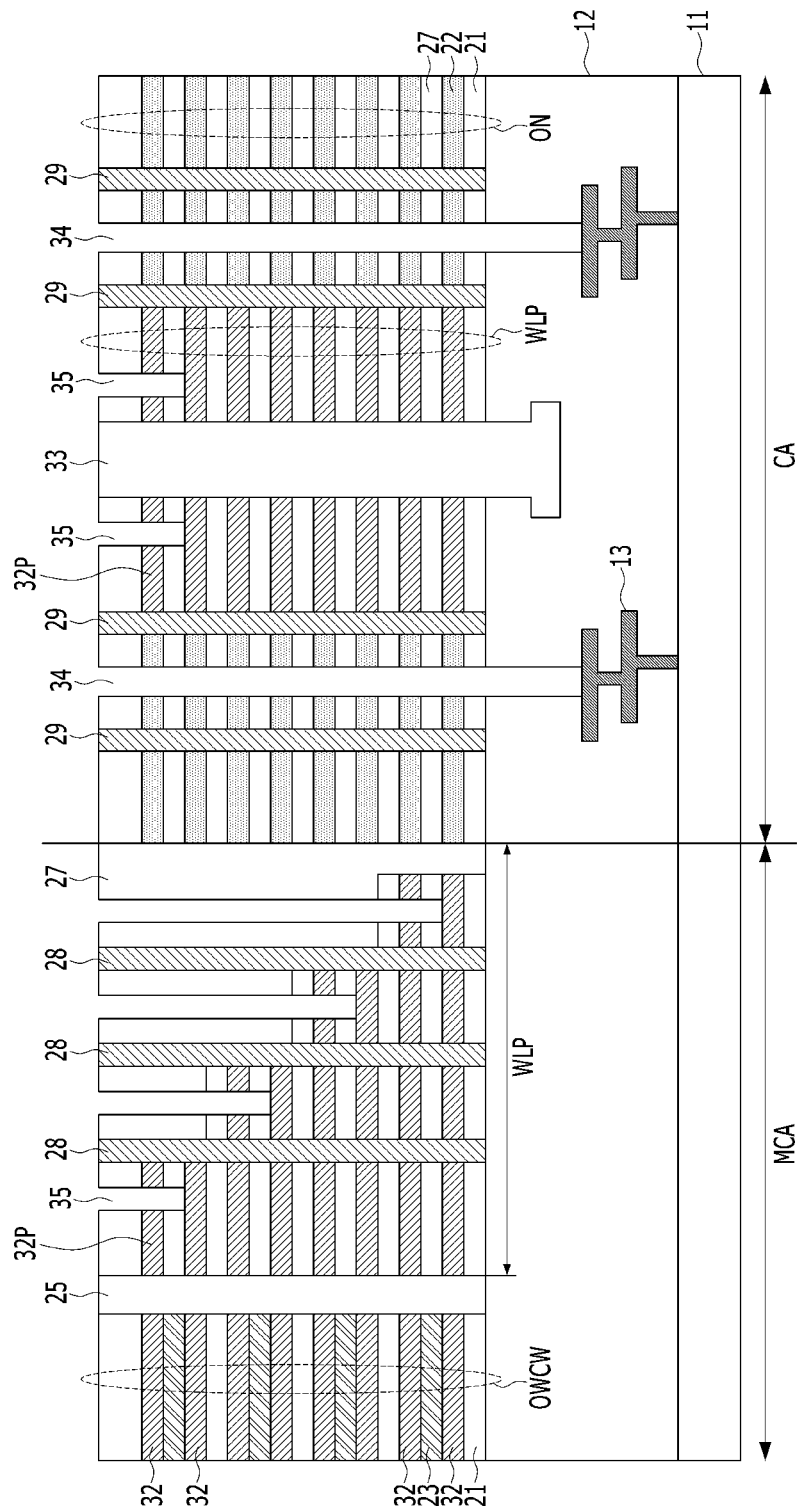

Referring to FIG. 8H, first and second contact holes 34 and 35 exposing the edge portions of the word lines 32 and the interconnections 12 may be formed. The first contact hole 34 may expose the interconnections 13, and the second contact hole 35 may expose the edge portions of the word lines 32.

Figure 8I:
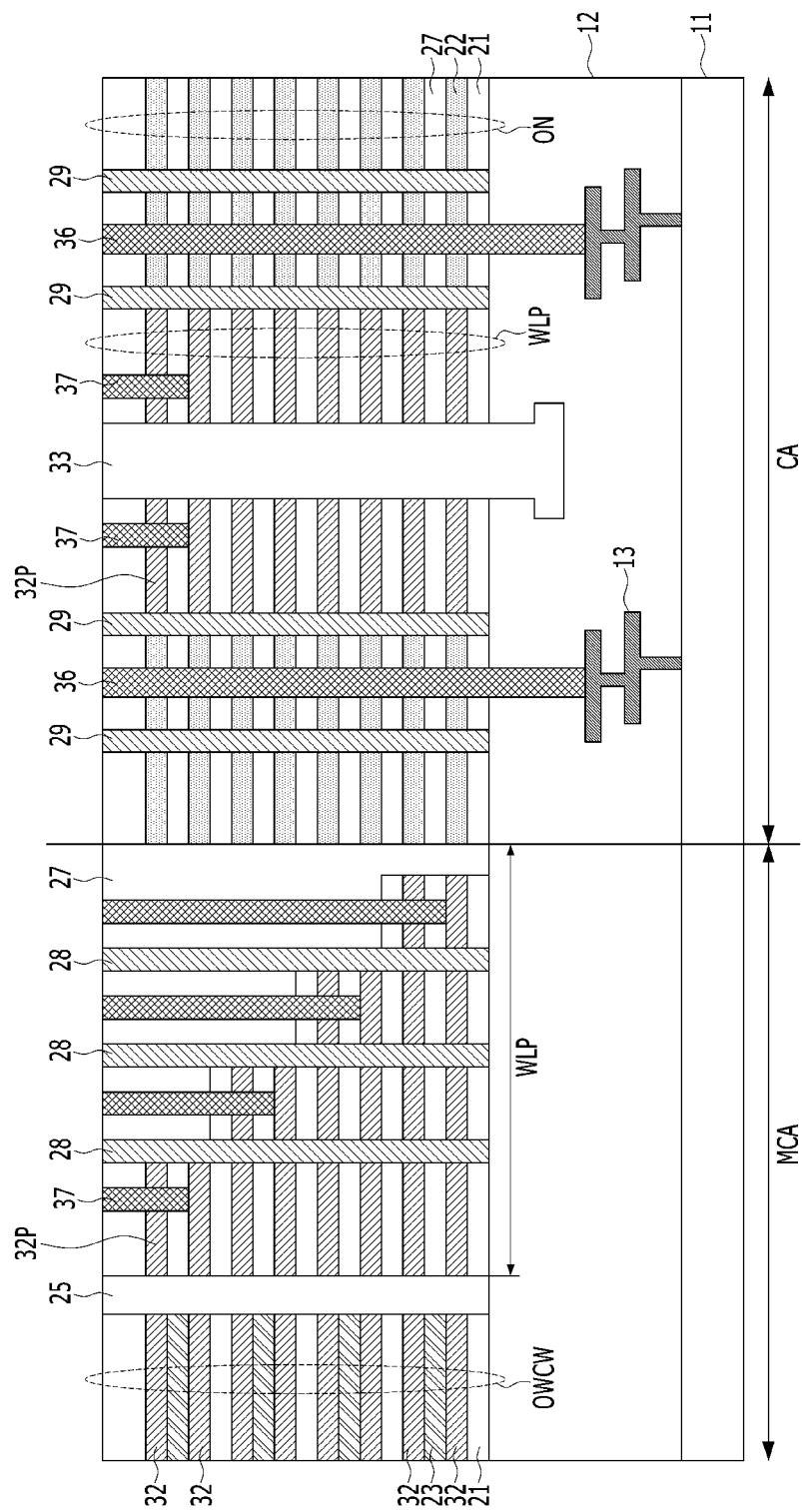

Referring to FIG. 8I, first and second contact plugs 36 and 37 may be formed to fill the first and second contact holes 34 and 35, respectively. The first contact plug 36 may be coupled to the interconnections 13, and the second contact plug 37 may be coupled to the word line 32. The first contact plug 36 may be referred to as a peripheral contact plug, and the second contact plug 37 may be referred to as a word line pad contact plug.

Figure 9:
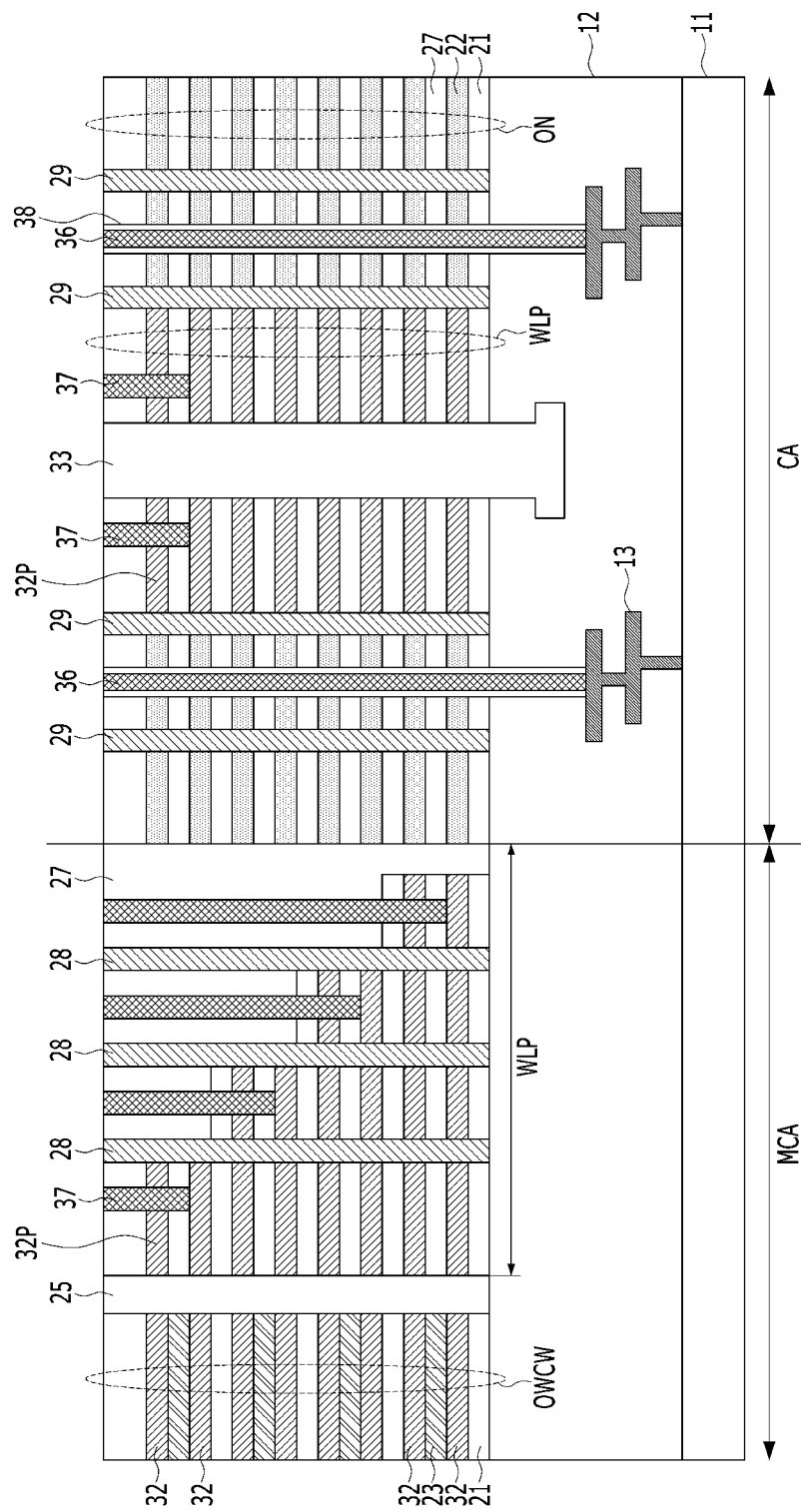
FIG. 9 is a cross-sectional view illustrating a method for fabricating a semiconductor memory device in accordance with another embodiment of the present invention.

FIG. 9 is a cross-sectional view illustrating a method for fabricating a semiconductor memory device in accordance with another embodiment of the present invention.

First, after the first and second contact holes 34 and 35 are formed according to the method described in FIGS. 8A to 8H, a contact spacer 38 may be formed on the sidewall of the first contact hole 34, as illustrated in FIG. 9. The contact spacer 38 may include silicon oxide or silicon nitride.

Subsequently, referring to FIG. 8I, first and second contact plugs 36 and 37 may be formed to fill the first and second contact holes 34 and 35, respectively. The first contact plug 36 may be coupled to the interconnections 13, and the second contact plug 37 may be coupled to the word line 32.

Figure 10:
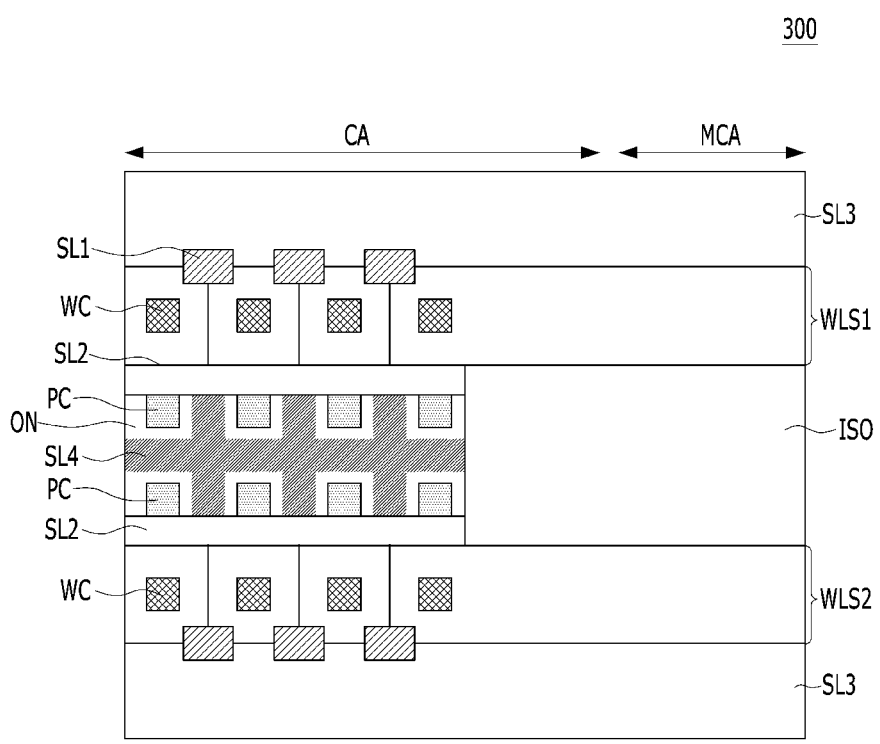
FIG. 10 is a view illustrating a semiconductor memory device in accordance with another embodiment of the present invention.

FIG. 10 illustrates a semiconductor memory device 300 in accordance with another embodiment of the present invention. The semiconductor memory device 300 shown in FIG. 10 may be similar to the semiconductor memory device 200 shown in FIG. 5.

Referring to FIG. 10, an additional slit SL4 may be further formed in the contact region CA. The additional slit SL4 may be positioned between the peripheral contact plugs PC. The additional slit SL4 may penetrate the alternating stack ON between the peripheral contact plugs PC. The additional slit SL4 may have a grid or lattice shape and may serve as a supporter.

Figure 11:
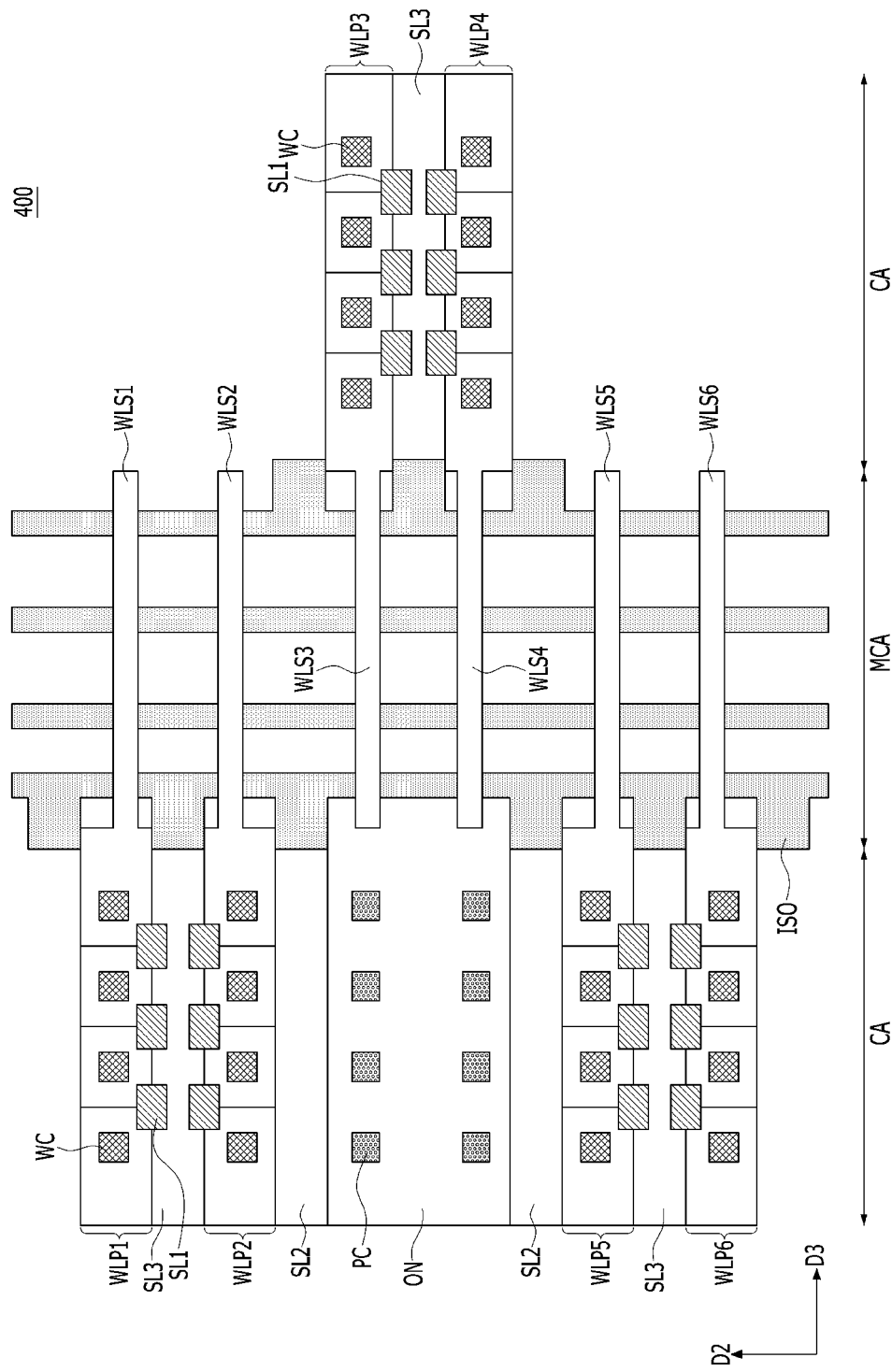
FIG. 11 illustrates a semiconductor memory device in accordance with another embodiment of the present invention.

FIG. 11 illustrates a semiconductor memory device 400 in accordance with another embodiment of the present invention. The semiconductor memory device 400 shown in FIG. 11 may be similar to the semiconductor memory device 200 shown in FIG. 5.

Referring to FIG. 11, the semiconductor memory device 400 may include word line stacks WLS1 to WLS6. The word line stacks WLS1 to WLS6 may extend long in the third direction D3. Cell isolation layers ISO may be formed between the neighboring word line stacks WLS1 to WLS6.

The word line stacks WLS1 to WLS6 may include word line pad stacks WLP1 to WLP6, respectively. The word line contacts WC may be respectively coupled to the word line pad stacks WLP1 to WLP6.

Among the word line pad stacks WLP1 to WLP6, a word line pad stack WLP1 to WLP6 and a neighboring word line pad stack may form a pair. For example, the first word line pad stack WLP1 and the second word line pad stack WLP2 may be paired, and the third word line pad stack WLP3 and the fourth word line pad stack WLP4 may be paired. The fifth word line pad stack WLP5 and the sixth word line pad stack WLP6 may be paired.

The word line pad stacks WLP1 to WLP6 may be arranged in a zigzag array. The first word line pad stack WLP1 and the second word line pad stack WLP2 may be positioned toward one side of the first word line stack WLS1 and the second word line stack WLS2, respectively, and the third word line pad stack WLP3 and the fourth word line pad stack WLP4 may be positioned toward another side of the third word line stack WLS3 and the fourth word line stack WLS4, respectively. The fifth word line pad stack WLP5 and the sixth word line pad stack WLP6 may be positioned toward one side of the fifth word line stack WLS5 and the sixth word line stack WLS6, respectively.

The first word line pad stack WLP1 and the second word line pad stack WLP2 may form one stepped word line pad stack pair, and the fifth word line pad stack WLP5 and the sixth word line pad stack WLP6 may form one stepped word line pad stack pair. Accordingly, two stepped word line pad stack pairs may be adjacent to each other with the alternating stack ON interposed therebetween. The third word line pad stack WLP3 and the fourth word line pad stack WLP4 may form one stepped word line pad stack pair. The third word line pad stack WLP3 and the fourth word line pad stack WLP4 may be arranged in a zig-zag pattern with respect to the stepped word line pad stack pair that is formed of the first word line pad stack WLP1 and the second word line pad stack WLP2 and with respect to the stepped word line pad stack pair that is formed of the fifth word line pad stack WLP5 and the sixth word line pad stack WLP6.

Slits SL1 may be positioned between the first word line pad stack WLP1 and the second word line pad stack WLP2. The slits SL1 may be positioned between the third word line pad stack WLP3 and the fourth word line pad stack WLP4. The slits SL1 may be positioned between the fifth word line pad stack WLP5 and the sixth word line pad stack WLP6.

Slits SL2 may be positioned between the second word line pad stack WLP2 and the fifth word line pad stack WLP5, and peripheral contact plugs PC penetrating the alternating stack ON may be positioned between the slits SL2.

According to the above-described embodiment of the present invention, since the slits are formed, bending of the word line stacks may be prevented. Since the word line pads are formed, word line contact resistance may be improved.

According to one embodiment of the present invention, since a slit (or a supporter) is applied, it may be possible to prevent bending of a word line stack.

Also, according to one embodiment of the present invention, a contact plug and an interconnection layer may be coupled to each other as described above.

Also, according to one embodiment of the present invention, since a word line pad is formed, word line contact resistance may be improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a peripheral circuit portion including an interconnection;
a first word line stack and a second word line stack that are spaced apart from each other over the peripheral circuit portion, and the first and second word line stack include a plurality of word lines, respectively;
an alternating stack of a plurality of dielectric layers that are positioned over the peripheral circuit portion and disposed between the first word line stack and the second word line stack;
a first contact plug penetrating the alternating stack to be coupled to the interconnection;
a second contact plug coupled to the word lines of the first and second word line stacks;
a first line-shape supporter between the first word line stack and the alternating stack, and extending vertically from the peripheral circuit portion; and
a second line-shape supporter between the second word line stack and the alternating stack, and extending vertically from the peripheral circuit portion,
wherein each of the first and second word line stacks includes stepped word line pads, and
wherein the first contact plugs are positioned between the stepped word line pads of the first word line stack and the stepped word line pads of the second word line stack.

2. The semiconductor memory device of claim 1, wherein each of the first and second word line stacks includes first dielectric layers and the word lines, with the first dielectric layers and word lines alternately stacked.

3. The semiconductor memory device of claim 1, wherein the alternating stack includes second dielectric layers and third dielectric layers that are alternately stacked.

4. The semiconductor memory device of claim 1, further comprising:
an active layer positioned between the word lines;
a bit line coupled to one side of the active layer and oriented vertically with respect to the peripheral circuit portion; and
a capacitor coupled to another side of the active layer,
wherein the word lines include a double word line in which two word lines face each other with the active layer interposed therebetween.

5. The semiconductor memory device of claim 1, further comprising:
a contact spacer formed on sidewalls of the first contact plugs.

6. The semiconductor memory device of claim 1, further comprising:
   a lattice-shape supporter penetrating the alternating stack between the second contact plugs.

7. The semiconductor memory device of claim 1, wherein the first and second word line stacks are part of a memory cell array of a Dynamic Random Access Memory (DRAM).

8. The semiconductor memory device of claim 1, further comprising:
   a plurality of pillar-shape supporters that are spaced apart from the first and second line-shape supporters to support the first and second word line stacks.

9. The semiconductor memory device of claim 8, wherein the first and second line-shape supporters and the pillar-shape supporters include a dielectric material.

10. A method for fabricating a semiconductor memory device, comprising:
    forming a peripheral circuit portion including an interconnection over a substrate;
    forming line-shaped alternating stacks which include stepped pads positioned in a memory cell array region of the peripheral circuit portion and not overlapping a contact region of the peripheral circuit portion, and which include a dielectric layer, a first sacrificial layer, a semiconductor layer, and a second sacrificial layer that are alternately stacked in a mentioned order;
    forming a plurality of supporters that support sidewalls of the stepped pads;
    replacing the first and second sacrificial layers with word lines that are paired with the semiconductor layer interposed therebetween;
    forming a first contact plug that is coupled to the interconnection; and
    forming a second contact plug that is coupled to an edge portion of each of the word lines.

11. The method of claim 10, wherein the dielectric layer includes an oxide, and the first and second sacrificial layers include a nitride, and the semiconductor layer includes polysilicon.

12. The method of claim 10, wherein the dielectric layer of the alternating stack includes a silicon oxide, and the first and second sacrificial layers of the alternating stack include a silicon nitride, and the semiconductor layer of the alternating stack includes polysilicon.

13. The method of claim 10, wherein the forming of the plurality of the supporters includes:
    forming pillar-shape supporters that support first sidewalls of the stepped pads of the alternating stack; and
    forming line-shape supporters that support second sidewalls of the stepped pads of the alternating stack.

14. The method of claim 13, wherein the pillar-shape supporters and the line-shape supporters are formed of a dielectric material.

15. The method of claim 10, further comprising:
    forming a sacrificial pad at a higher level than the interconnection, before the forming of the line-shaped alternating stacks.

16. The method of claim 15, further comprising:
    etching the line-shaped alternating stacks to stop on the sacrificial pad to form a trench;
    etching the first and second sacrificial layers through the trench to form recesses; and
    removing the sacrificial pad exposed by the trench,
    wherein the recesses are filled with the word lines.

17. The method of claim 15, wherein the sacrificial pad includes a metal material.

18. A semiconductor memory device, comprising:
    a peripheral circuit portion including an interconnection;
    an alternating stack of a plurality of dielectric layers that are positioned over the peripheral circuit portion;
    first contact plugs penetrating the alternating stack to be coupled to the interconnection;
    two neighboring stepped word line pad stack pairs with the alternating stack interposed therebetween;
    second contact plugs that are respectively coupled to the word line pad stack pairs; and
    line-shape supporters that are positioned between the word line pad stack pairs and the alternating stack.

19. The semiconductor memory device of claim 18, further comprising:
    another word line pad stack pair that is positioned in a zig-zag form with respect to the two stepped word line pad stack pairs.

* * * * *